(12) United States Patent
Barone et al.

(10) Patent No.: US 6,511,760 B1
(45) Date of Patent: Jan. 28, 2003

(54) METHOD OF PASSIVATING A GAS VESSEL OR COMPONENT OF A GAS TRANSFER SYSTEM USING A SILICON OVERLAY COATING

(75) Inventors: Gary A. Barone, State College, PA (US); Andy S. Schuyler, Bellefonte, PA (US); Joseph Stauffer, Bellefonte, PA (US)

(73) Assignee: Restek Corporation, Bellefonte, PA (US)

( * ) Notice: Subject to any disclaimer, the term of this patent is extended or adjusted under 35 U.S.C. 154(b) by 0 days.

(21) Appl. No.: 09/259,656

(22) Filed: Feb. 26, 1999

Related U.S. Application Data

(60) Provisional application No. 60/076,386, filed on Feb. 27, 1998.

(51) Int. Cl.[7] .......................... B65D 85/00; C23C 8/06; B32B 15/00
(52) U.S. Cl. .................. 428/641; 428/336; 428/212; 428/446; 206/0.6; 148/279; 148/508
(58) Field of Search ................................ 427/452, 255, 427/248.1, 230, 237, 238; 423/348, 349; 118/715, 50; 206/0.6; 148/279, 508; 428/450, 446, 641, 336, 212

(56) References Cited

U.S. PATENT DOCUMENTS

| | | | | | |
|---|---|---|---|---|---|
| 3,652,331 A | * | 3/1972 | Yamazaki | .................. | 117/201 |
| 3,853,974 A | * | 12/1974 | Reuschel et al. | .............. | 264/81 |
| 4,173,661 A | * | 11/1979 | Bourdon | ....................... | 427/39 |
| 4,656,021 A | * | 4/1987 | Tanabe et al. | ............... | 423/350 |
| 4,683,146 A | * | 7/1987 | Hirai et al. | ................. | 427/54.1 |
| 4,762,803 A | * | 8/1988 | Sato et al. | ..................... | 437/24 |
| 5,299,731 A | * | 4/1994 | Liyanage et al. | ........... | 228/219 |
| 5,480,677 A | * | 1/1996 | Li et al. | .................. | 427/248.1 |

* cited by examiner

*Primary Examiner*—Deborah Jones
*Assistant Examiner*—Stephen Stein
(74) *Attorney, Agent, or Firm*—John F. A. Earley; John F. A. Earley, III; Harding, Earley, Follmer & Frailey

(57) ABSTRACT

A method of passivating the interior surface of a gas storage vessel to protect the surface against corrosion. The interior surface of the vessel is first dehydrated and then evacuated. A silicon hydride gas is introduced into the vessel. The vessel and silicon hydride gas contained therein are heated and pressurized to decompose the gase. A layer of silicon is deposited on the interior surface of the vessel. The duration of the silicon depositing step is controlled to prevent the formation of silicon dust in the vessel. The vessel is then purged with an inert gas to remove the silicon hydride gas. The vessel is cycled through the silicon depositing step until the entire interior surface of the vessel is covered with a layer of silicon. The vessel is then evacuated and cooled to room temperature.

20 Claims, No Drawings

METHOD OF PASSIVATING A GAS VESSEL OR COMPONENT OF A GAS TRANSFER SYSTEM USING A SILICON OVERLAY COATING

The is a non-provisional application claiming priority to provisional application No. 60/076,386 filed Feb. 27, 1998 entitled Method for Application of a Silicon Overlay Coating for the Passivation and Corrosion Resistance of Gas Storage and Transfer Systems, incorporoated herein by reference.

FIELD OF THE INVENTION

The present invention relates to a method of passivating a gas vessel or component of a gas transfer system to reduce corrosion. More particularly, the present invention relates to an improved method of applying a silicon passivation layer to the interior surface of gas storage vessels and components of transfer systems to passivate the interior surface.

BACKGROUND OF THE PRIOR ART

The present invention overcomes many known deficiencies of using silicon as a passivation layer for metal (ferrous and non-ferrous) surfaces.

Previous art has focused on layers of silicon modified by oxidation to prevent adsorption. Other previous art has looked at the use of silanes or silicon hydrides passed through metal surfaces at low temperatures to passivate the metal surface. This invention is specifically optimized for storage vessels used for holding species which degrade, are adsorbed or attack metal surfaces (organo-sulfurs, hydrogen sulfide, alcohols, acetates, metal hydries, hydrochloric acid, nitric acid, sulfuric acid).

The prior art has utilized a single treatment of silicon hydride gases, either for silicon deposition or adsorption to metal surfaces, to impart passivation. This invention utilizes singla and multiple treatments with the silicon hydride gases to impart desired passivation by deposition of silicon.

The prior art also has not focused on the surface roughness of articles to be coated with a silicon layer for passivation. This work has noted that the number of applications of silicon layers is dependent on surface roughness.

Prior art also indicates preparation of metals surfaces by exposure to reducing gases prior to silicon deposition. This invention does not utilize such a pretreatment to achieve a passive surface.

SUMMARY OF THE INVENTION

The present invention provides a method of passivating any surface of a gas storage and transfer system to protect the surface against corrosion. The present invention also provides gas storage vessels and gas transfer components having corrosive gas contact surfaces which have been passivated in accordance with the method of the present invention.

In the method of the present invention, the surface of, for example, the storage vessel is initially preconditioned by dehydrating the interior surface of the vessel. In the dehydration step, the vessel is heated to a temperature in the range of 360° to 600° C. for 30 to 240 minutes. The storage vessel is preferably heated in an inert gas or in a vacuum.

After the surfaces of the vessel have been dehydrated, the interior of the vessel is evacuated. A silicon hydride gas is introduced into the storage vessel. The vessel and gas contained therein are heated and pressurized to decompose the silicon, hydride gas in the chamber. As the gas decomposes, a layer of silicon is deposited on the interior surface of the vessel.

The duration of the silicon deposition step is controlled to prevent the formation silicon dust in the vessel. At the end of the silicon deposition step, the vessel is purged with an inert gas to remove the silicon hydride gas. If the silicon layer completely covers the interior surface of the vessel, the vessel is then evacuated and cooled to room temperature. If the silicon layer does not completely cover the interior surface, the silicon deposition step is repeated until the interior surface is completely covered and thereby passivated.

In the method of the present invention, the silicon hydride gas is preferably selected from the group comprising $SiH_4$ and $SinHn^{+2}$. The silicon hydride gas is heated to a temperature approximately equal to the gas's decomposition temperature, preferably to a temperature in the range of 360° to 600° C. Preferably, the silicon hydride gas is pressurized to a pressure in the range of 2 to 45 p.s.i.a.

The duration of the silicon deposition step should be in range of 30 to 240 minutes depending on the roughness average (RA) of the surface. Therefore, the method of the present invention may also include the step of measuring the average surface roughness (RA) of the interior surface of the vessel before dehydrating the vessel. If the surface RA is less than about 20 microinches, the silicon deposition step should be repeated 1 to 2 times or until the silicon layer is 120 to 500 angstroms in thickness. If the surface RA is greater than about 20 microinches, the silicon deposition step should be repeated 2 to 5 times or until the silicon layer is 501 to 50,000 angstroms.

The present invention also provides a corrosion resistant gas storage vessel or gas transfer system component having a passivated surface. The metallic interior surface of the vessel or component has an average surface roughness RA. A silicon layer is formed over the entire interior surface to passivate the surface. The silicon layer is formed from a plurality of layers of silicon and is substantially free of silicon dust.

If the surface has an RA less than about 20 microinches, the silicon layer has a thickness in the range of 120 to 500 angstroms. If the surface has an RA greater than about 20 microinches, the silicon layer has a thickness in the range of 501 to 50,000 angstroms.

DESCRIPTION OF PREFERRED EMBODIMENTS

The method of the present invention is described below with reference to a gas storage vessel. However, it should be appreciated to those of ordinary skill in the art that the method of the present invention may by used to passivate the surface of any component of a gas storage and transfer system which contacts a corrosive gas such as organo-sulfurs, hydrogen sulfide, alcohols, acetates, metal hydries, hydrochloric acid, nitric acid, or sulfuric acid gases to protect the surface against corrosion.

In the method of the present invention, the surface to be passivated is initially preconditioned. Successive layers of silicon are then applied to the surface under controlled conditions until the silicon layer covers the entire surface area of the vessel. The thickness of the silicon layer is dependent on the average roughness of the surface.

The surface of the vessel is initially preconditioned by dehydrating any water adsorbed on the interior metal surface. In the dehydration step, the vessel is heated to a temperature in the range of 360° to 600° C. for a time period between 30 minutes and 4 hours. During the dehydration step, the interior of the vessel is either evacuated or filled with an inert gas (noble gases or nitrogen) to prevent any reaction with the evaporating water. At the end of the dehydration process, the vessel is evacuated to remove the vaporized water.

After the vessel is dehydrated and evacuated, silicon hydride gas, such as $SiH_4$ or $SiHn^{+2}$, is introduced into the vessel. Preferably, the pressure of the silicon hydride gas is between 2 and 45 p.s.i.a. The vessel, and gas contained therein, is heated to a temperature approximately equal to the gas decomposition temperature. Preferably, the vessel and gas are heated to a temperature in the range of 360° to 600° C. At these pressures and temperatures, the silicon hydride gas decomposes into silicon and hydrogen gas at or near the metal surface. The silicon formed during the decomposition process attaches to the interior surface of the vessel.

The duration of the silicon deposition process is controlled in accordance with the method of the present invention. Under the above-described conditions, the decomposition of silicon hydride gas in the vessel will eventually also form an undesirable by-product referred to herein as silicon dust. Silicon dust is the result of the silicon hydride gas reacting with itself to form silicon and the gas phase. This gas phase nucleation forms silicon dust which will settle to the surface of the vessel by gravity and compromise the integrity of the silicon layer being formed on the metal surface. The silicon dust creates a physical barrier between successive layers of silicon in the passive layer.

In order to prevent the formation of silicon dust, the duration of the silicon deposition process must be controlled and limited to a period in the range of 30 minutes up to no longer than 4 hours. However, because the silicon deposition process is abbreviated to prevent the formation of silicon dust, the layer of silicon may not completely cover the entire interior surface of the vessel after one silicon deposition cycle. Therefore, the silicon deposition cycle is repeated several times to build up the passive layer of silicon to the requisite thickness.

After the first silicon deposition cycle, the storage vessel is purged with an inert gas to remove the silicon hydride gas. If the layer of silicon does not completely cover the interior surface of the vessel, the silicon deposition cycle is repeated. Products such as large volume pressurized gas storage vessels require several cycles (1 to 5) as described above to totally cover the surface. Repeating the silicon deposition cycle insures that all exposed metal surface sites which can adsorb or react with corrosive gases stored in the vessel are passivated.

The number of silicon deposition cycles depends on the roughness average (RA) of the metal surface. A rough surface requires a thicker layer of silicon to be deposited on the surface to thoroughly protect the entire metal surface. For example, smooth (electropolished or polished) surfaces with an RA less than about 20 microinches require only 1 or 2 silicon deposition cycles to completely cover the interior surface. Rough surfaces with an RA over about 20 microinches require several silicon deposition cycles to completely cover the interior surface of the vessel.

After the passive layer of silicon is formed, the vessel is purged with an inert gas to remove the reactive silicon hydride gas. This inert gas purge insures that the decomposition reaction of the silicon hydride is stopped to reduce unwanted gas phase nucleation problems which occur due to reaction of the silicon hydride components with themselves as opposed to the surface of the metal vessel. After the final purging step, the vessel is evacuated and cooled to room temperature.

As described above, the thickness of the silicon layer deposited in accordance with the present invention is based on the RA of the surface to be passivated. For surfaces having an RA less than about 20 microinches, it is recommended that the passive silicon layer be 120 to 500 angstroms thick. For surfaces having an RA greater than about 20 microinches, it is recommended that the passive silicon layer be about 501 to 50,000 angstroms. thick.

The method of the present invention has particular use for passivating corrosive gas storage vessels, metal valves used for the release, redirection or transfer of corrosive gas, tubing used for the transport of corrosive gas, and all metal systems and components exposed to corrosive gas in chromatographic systems.

What is claimed is:

1. A method of passivating the interior surface of a gas storage vessel to protect the surface against corrosion, comprising the steps of:
   a) dehydrating the interior surface of the vessel;
   b) evacuating the interior of the vessel;
   c) introducing a silicon hydride gas into the vessel;
   d) heating and pressurizing the silicon hydride gas in the vessel;
   e) depositing a layer of silicon on the interior surface of the vessel;
   f) controlling the duration of the silicon depositing step to prevent the formation of silicon dust in the vessel;
   g) purging the vessel with an inert gas to remove the silicon hydride gas;
   h) cycling the vessel through steps b–g until the entire interior surface of the vessel is covered with a layer of silicon;
   i) evacuating the vessel; and,
   j) cooling the vessel to room temperature.

2. The method recited in claim 1, said dehydration step comprising heating the storage vessel to a temperature in the range of 360° to 600° C. for 30 to 240 minutes.

3. The method recited in claim 2, including the step of heating the storage vessel in an inert gas or in a vacuum.

4. The method recited in claim 1, said silicon hydride gas being selected from the group comprising $SiH_4$ and $SiHn^+2$.

5. The method recited in claim 1, said silicon hydride gas being heated to a temperature approximately equal to the gas's decomposition temperature.

6. The method recited in claim 5, said silicon hydride gas being heated to a temperature in the range of 360° to 600° C.

7. The method recited in claim 1, said silicon hydride gas being pressurized to a pressure in the range of 2 to 45 p.s.i.a.

8. The method recited in claim 1, said layer of silicon being deposited on the interior surface of the vessel for a period in the range of 30 to 240 minutes.

9. The method recited in claim 1, including the step of measuring the average surface roughness (RA) of the interior surface of the vessel before dehydrating the vessel.

10. The method recited in claim 9, including cycling the vessel 1 to 2 times if the surface RA is less than about 20 microinches, and cycling the vessel 2 to 5 times if the surface RA is greater than about 20 microinches.

11. The method recited in claim 9, including cycling the vessel until the silicon passivation layer is 120 to 500 angstroms in thickness if the vessel RA is less than about 20 microinches.

12. The method recited in claim 9, including cycling the vessel until the silicon passivation layer is 501 to 50,000 angstroms if the surface R,A is greater than about 20 microinches.

13. A corrosion resistant gas storage vessel having a passive interior surface, comprising:
   a) a metallic interior surface having an average surface roughness RA;
   b) a silicon layer formed over the entire interior surface, said silicon layer being formed from a plurality of sublayers of silicon which are substantially free of silicon dust;
      said interior surface having an average roughness RA less than about 20 microinches, and said silicon layer having a thickness in the range of 120 to 500 angstroms.

14. A corrosion resistant gas storage vessel having a passive interior surface, comprising:
   a) a metallic interior surface having an average surface roughness RA;
   b) a silicon layer formed over the entire interior surface, said silicon layer being formed from a plurality of sublayers of silicon which are substantially free of silicon dust;
      said interior surface having an average roughness RA greater than about 20 microinches and said silicon layer having a thickness in the range of 501 to 50,000 angstroms.

15. A corrosion resistant gas storage vessel having a passive interior surface, comprising:
   a) a metallic interior surface having an average surface roughness RA;
   b) a silicon passivation layer formed over the entire interior surface;
      said interior surface having an average roughness RA less than about 20 microinches, and said silicon layer having a thickness in the range of 120 to 500 angstroms,
      said silicon passivation layer being substantially free of silicon dust and having been formed according to the following steps:
         a) dehydrating the interior surface of the vessel;
         b) evacuating the interior of the vessel;
         c) introducing a silicon hydride gas into the vessel;
         d) heating and pressurizing the silicon hydride gas in the vessel;
         e) depositing a layer of silicon on the interior surface of the vessel;
         f) controlling the duration of the silicon depositing step to prevent the formation of silicon dust in the vessel;
         g) purging the vessel with an inert gas to remove the silicon hydride gas;
         h) cycling the vessel through steps b–g until the entire interior surface of the vessel is covered with a layer of silicon;
         i) evacuating the vessel; and
         j) cooling the vessel to room temperature.

16. A method of passivating the interior surface of a gas storage vessel to protect the surface against corrosion, comprising the steps of:
   a) dehydrating the interior surface of the vessel;
   b) evacuating the interior of the vessel;
   c) introducing a silicon hydride gas into the vessel;
   d) heating and pressurizing the silicon hydride gas in the vessel;
   e) depositing a passivation layer of silicon on the interior surface of the vessel;
   f) controlling the duration of the silicon depositing step to prevent the formation silicon dust in the vessel;
   g) purging the vessel with an inert gas to remove the silicon hydride gas;
   h) cycling the vessel through steps b–g until the entire interior surface of the vessel is covered with a layer of silicon;
   i) evacuating the vessel; and,
   j) cooling the vessel to room temperature;
      said dehydration step comprising heating the storage vessel to a temperature in the range of 360° to 600° C. for 30 to 240 minutes;
      including the step of heating the storage vessel in an inert gas or in a vacuum;
      said silicon hydride gas being selected from the group comprising $SiH_4$ and $SinHn^{-2}$;
      said silicon hydride gas being heated to a temperature approximately equal to the gas's decomposition temperature;
      said silicon hydride gas being heated to a temperature in the range of 360° to 600° C.
      said silicon hydride gas being pressurized to a pressure in the range of 2 to 45 p.s.i.a.;
      said layer of silicon being deposited on the interior surface for a period in the range of 30 to 240 minutes;
      including the step of measuring the average roughness RA of the interior surface of the vessel before dehydrating the vessel;
      including cycling the vessel 1 to 2 times if the surface RA is less than about 20 microinches;
      including cycling the vessel until the silicon layer is 120 to 500 angstroms in thickness if the surface RA is less than about 20 microinches;
      including cycling the vessel 2 to 5 times if the surface RA is greater than about 20 microinches;
      including cycling the vessel until the silicon layer is 501 to 50,000 angstroms if the surface RA is greater than about 20 microinches.

17. A method of passivating the interior surface of a gas storage vessel to protect the surface against corrosion, comprising the steps of:
   a) measuring the average surface roughness (RA) of the interior surface of the vessel and then dehydrating the interior surface of the vessel;
   b) evacuating the interior of the vessel;
   c) introducing a silicon hydride gas into the vessel;
   d) heating and pressurizing the silicon hydride gas in the vessel;
   e) depositing a layer of silicon on the interior surface of the vessel;
   f) controlling the duration of the silicon depositing step to prevent the formation of silicon dust in the vessel;
   g) purging the vessel with an inert gas to remove the silicon hydride gas;
   h) cycling the vessel through steps b–g until the entire interior surface of the vessel is covered with a layer of silicon;
   i) evacuating the vessel; and, j) cooling the vessel to room temperature,
including cycling the vessel 1 to 2 times if the surface RA is less than about 20 microinches and cycling the vessel 2 to 5 times if the surface RA is greater than about 20 microinches.

18. The method recited in claim 17, including cycling the vessel until the silicon passivation layer is 501 to 50,000 angstroms if the surface RA is greater than about 20 microinches.

19. The method recited in claim 17, including cycling the vessel until the silicon passivation layer is 120 to 500 angstroms in thickness if the vessel RA is less than about 20 microinches.

20. A corrosion resistant gas storage vessel having a passive interior surface, comprising:
   a) a metallic interior surface having an average surface roughness RA;
   b) a silicon passivation layer formed over the entire interior surface;
      said interior surface having an average roughness RA greater than about 20 microinches, and said silicon layer having a thickness in the range of 501 to 50,000 angstroms,
      said silicon passivation layer being substantially free of silicon dust and having been formed according to the following steps:
      a) dehydrating the interior surface of the vessel;
      b) evacuating the interior of the vessel;
      c) introducing a silicon hydride gas into the vessel;
      d) heating and pressurizing the silicon hydride gas in the vessel;
      e) depositing a layer of silicon on the interior surface of the vessel;
      f) controlling the duration of the silicon depositing step to prevent the formation of silicon dust in the vessel;
      g) purging the vessel with an inert gas to remove the silicon hydride gas;
      h) cycling the vessel through steps b–g until the entire interior surface of the vessel is covered with a layer of silicon;
      i) evacuating the vessel; and
      j) cooling the vessel to room temperature.

* * * * *